United States Patent [19]
Provost et al.

[11] Patent Number: 5,924,051
[45] Date of Patent: Jul. 13, 1999

[54] DEMAND METER HAVING LOAD PROFILE RECORDING CAPABILITIES

[75] Inventors: Roland J. Provost, Dover, N.H.;
Thomas Maehl, Philadelphia, Pa.;
Gregory P. Lavoie, Lee, N.H.; Ellen D. Edge, Collinsville, Conn.; Mark J. Plis, Barrinton, N.H.

[73] Assignee: General Electric Company, Schenectady, N.Y.

[21] Appl. No.: 08/954,419

[22] Filed: Oct. 20, 1997

Related U.S. Application Data

[63] Continuation of application No. 08/574,256, Nov. 30, 1995, abandoned, and a continuation-in-part of application No. 08/357,600, Dec. 16, 1994, Pat. No. 5,525,898.

[51] Int. Cl.$^6$ ................................................. G01R 11/63
[52] U.S. Cl. ............................... 702/61; 702/60; 702/62; 364/528.26; 324/103 R; 324/116; 324/142; 340/870.02
[58] Field of Search .................................. 702/60–62, 64, 702/65, 79, 85, 176–178, 187, 189; 364/923.2, 528.26, 528.3, 528.31, 528.32, 528.33; 324/142, 103 R, 113–116, 134, 139, 140 R, 140 D, 141; 705/410, 404, 411; 340/870.02, 870.3, 870.16, 870, 39, 687; 235/373–377, 116, 60.4, 60.45, 201 R, 91 D

[56] References Cited

U.S. PATENT DOCUMENTS

| | | | |
|---|---|---|---|
| 4,697,182 | 9/1987 | Swanson | 340/870.02 |
| 5,315,235 | 5/1994 | Atherton et al. | 324/116 |
| 5,317,546 | 5/1994 | Balch et al. | 324/116 |
| 5,525,898 | 6/1996 | Lee, Jr. et al. | 324/113 |
| 5,537,029 | 7/1996 | Hemminger et al. | 324/142 |
| 5,537,333 | 7/1996 | Hemminger et al. | 702/60 |
| 5,544,089 | 8/1996 | Hemminger et al. | 702/64 |
| 5,546,318 | 8/1996 | Lee, Jr. | 364/483 |
| 5,548,527 | 8/1996 | Hemminger et al. | 702/62 |
| 5,555,508 | 9/1996 | Munday et al. | 702/60 |
| 5,706,214 | 1/1998 | Putt et al. | 324/142 |

*Primary Examiner*—Hal Dodge Wachsman
*Attorney, Agent, or Firm*—Carl B. Horton

[57] ABSTRACT

A demand electronic electricity meter having load profile recording capabilities is presented. Load profile recording requires memory for storing the recorded information, whereby either on-board memory or external memory is required. Load profile parameters include the number of channels (e.g., 1, 2 or more channels), interval size (e.g., 1, 5, 10, 15, 30 or 60 minutes), quantities to be recorded (e.g., kWh and kvarh, kVAh, or Qh) and channel scalar/divisor (e.g., for each channel, a 2 byte divisor and a 2 byte scalar). With two channels, only two quantities are available for recording, kWh and the one other quantity that the meter has been configured to record, (e.g., kvarh, KVAh, or kQh). For each quantity selected, snapshots of the corresponding total accumulator; (i.e. total kWh and total kvarh, kVAh or kQh) are automatically maintained.

28 Claims, 1 Drawing Sheet

DEMAND METER HAVING LOAD PROFILE RECORDING CAPABILITIES

This application is a Continuation of U.S. application Ser. No. 08/574,256, filed Nov. 30, 1995, now abandoned, and is also a continuation-in-part of U.S. application Ser. No. 08/357,600, filed Dec. 16, 1994, which is now U.S. Pat. No. 5,525,898.

BACKGROUND OF THE INVENTION

The present invention relates generally to electricity meters. More specific, the present invention relates to electricity demand meters with load profile recording capability.

Electricity meters are well known. These meters can be electromechanical based meters whose output is generated by a rotating disk, electronic based meters whose output component is generated electronically, and hybrid meters which use an electronic register in combination with a rotating disk. Electronic registers are in common use today with induction type watthour meters. Typically the induction type watthour meter contains a pulse initiator which senses rotation of the meter disc and provides pulses proportional to energy consumption to the register. Optical sensors for detecting rotation of the meter disc which provide pulses proportional to energy consumption to the register are also known. These electronic meters are typically used for the measurement of kilowatt demand and/or time of use (TOU) energy consumption. In electricity metering, electric utility companies historically have found it desirable to measure, in addition to total kilowatt-hours (real volt amperes), power factor, KVA, or reactive volt amperes.

The aforementioned demand meters only measure kilowatt, KQ, Kvar, or KVA demand. Demand calculations are determined by rolling, block or thermal demands. A rolling demand calculation allows the interval used for calculating demand to be subdivided into even subintervals. The demand calculation is then made at the end of each subinterval. Block demand is a special case of rolling demand where the block demand interval equals one subinterval of the rolling demand calculation. Thermal demand is the thermal measurement of kilowatts or KVA. The electronic meters utilizes an algorithm to emulate this thermal measurement. Regardless of which demand calculation is made, the maximum demand is typically continuously displayed by the meter.

The aforementioned TOU meters also calculate kilowatt demand. However, TOU meters also keep time and date information, and a rate schedule. The electricity is metered in accordance with the rate schedule for different time periods and days.

The electronic demand and TOU meters are well known in the art. Further, in order to accumulate data representative of these types of consumption, a time base is usually required with both meter types. This time base is used for interval timing of typically 5, 15, 30 or 60 minutes for calculation of kilowatt demand and for keeping time and date information in time of use meters.

For a detailed description pertaining to electricity metering and in particular for detailed information pertaining to the various types of electrical services and distribution systems and the types of meters utilized to perform kilowatt-hour, varhour and Qhour metering, reference is made to the Handbook for Electricity Metering, Eighth Edition, published by the Edison Electric Institute.

Load profile recording has been applied to TOU meters, whereby energy consumption is recorded (i.e., stored) in discrete time intervals. The recording of this information allows the user to analyze electricity use and modify usage to take advantage of lower rate time periods. Again the time periods and rates are defined in the stored rate schedule in the TOU meter. This method of recording usage in discrete time intervals requires the user to back track the time of usage in the discrete time intervals from the time recorded information was accessed.

SUMMARY OF THE INVENTION

The above-discussed and other drawbacks and deficiencies of the prior art are overcome or alleviated by the demand electronic electricity meter having load profile recording capabilities of the present invention. In accordance with the present invention, the meter comprises voltage sensors and current sensors with the analog outputs thereof presented to an A/D converter, which converts these analog signals to digital signals. The digital signals are presented to a digital signal processor where short interval calculations are performed.

These calculations are presented to a microcomputer which performs the demand calculations, e.g., rolling, block and/or thermal demands, and energy calculations e.g., kWh, and kvarh, kVAh or kQh. Data is displayed by a LCD in response to display signals received from the microcomputer. As is typical in the industry, a demand calculation indicative of cumulative electricity usage is displayed. Non-volatile RAM is provided to store the algorithms for the demand calculations. A power supply, which is powered by the service electricity, provides appropriate power to the components of the meter. It will be appreciated that the use of non-volatile RAM is important since information and system programming will not be lost during a power interruption or outage.

It will be appreciated that the present invention also applies to electronic demand registers, i.e., optical or induction sensors for detecting rotation of a meter disk and generating pulses indicative of such rotation, as is well known. The electronic demand registers are limited in energy calculations to KWh.

The above describes a demand electronic electricity meter to which is added load profile recording capabilities. A load profile recorder is provided which communicates with the microcomputer. Load profile recording requires memory for storing the recorded information, whereby either on-board memory or external memory is required. Load profile programming will configure the memory, if not previously configured, before recording. Load profile configuration data is pre-programmed to determine memory availability. The memory is used to store blocks of load profile data.

Inputs for configuring load profile memory are transported in a standard table format. Load profile parameters include the number of channels (e.g., 1, 2, or more channels), interval size (e.g., 1, 5, 10, 15, 30 or 60 minutes), quantities to be recorded (e.g., kWh and kvarh, kVAh, or Qh) and channel scalar/divisor (e.g., for each channel, a 2 byte divisor and a 2 byte scalar). With two channels, only two quantities are available for recording, kWh and the one other quantity that the meter has been configured to record, (e.g., kvarh, KVAh, or kQh). For each quantity selected, snapshots of the corresponding total accumulator; (i.e. total kWh and total kvarh, kVAh or kQh) are automatically maintained.

The above-discussed and other features and advantages of the present invention will be appreciated and understood by those skilled in the art from the following detailed description and drawings.

DESCRIPTION OF THE PREFERRED EMBODIMENT

Figure 1:
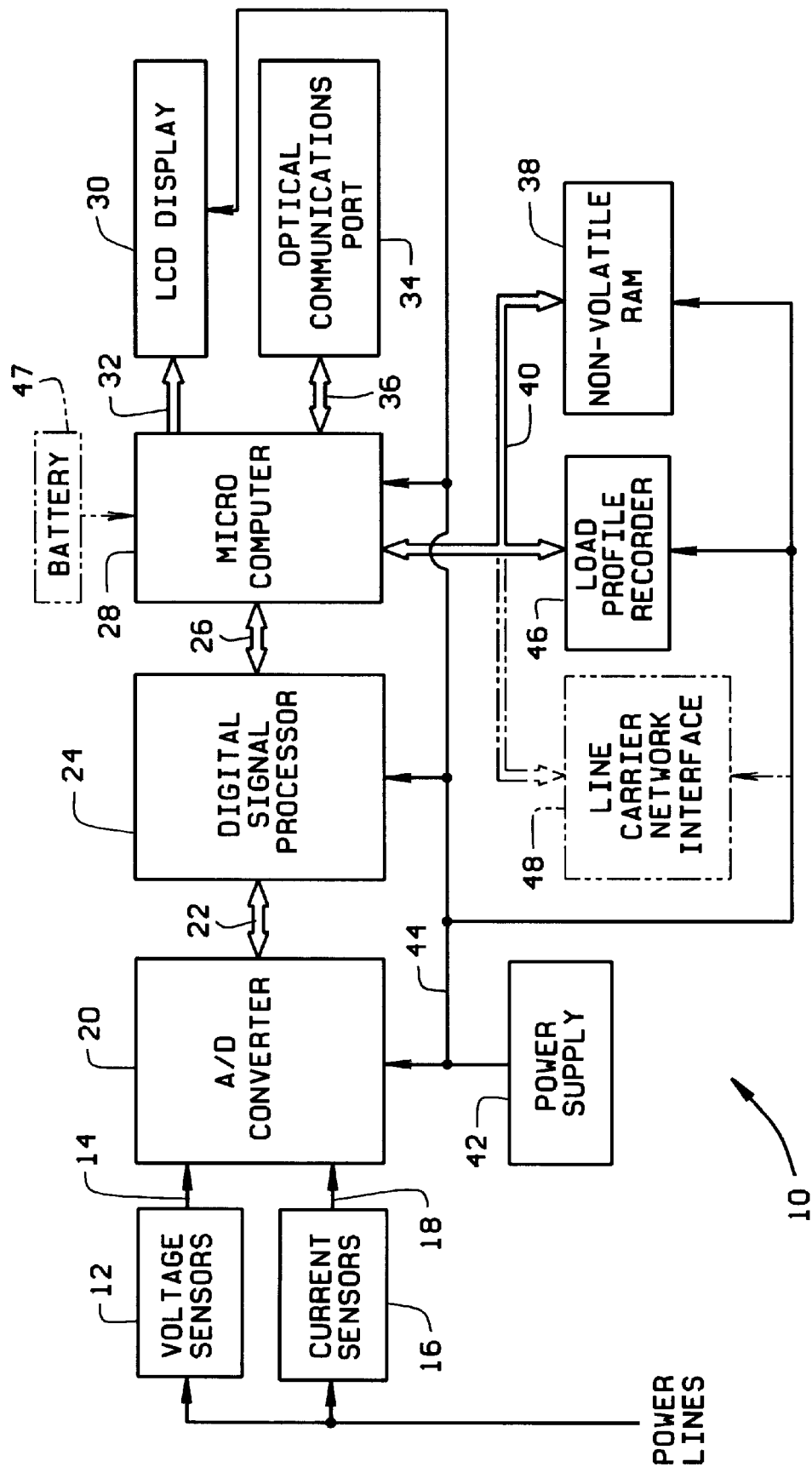
FIG. 1 is a schematic block diagram of a demand electronic electricity meter having load profile recording capabilities in accordance with the present invention.

In general the present invention comprises a demand electronic electricity meter having load profile recording capabilities. Referring to the FIGURE, a schematic block diagram of a meter in accordance with the present invention is shown generally at 10. Meter 10 comprises a voltage sensor 12 which provides analog signals indicative of voltage measurements on a signal line 14 and a current sensor 16 which provides analog signals indicative of a current measurements on a signal line 18. The analog signals on line 14 and 18 are presented to an A/D (analog/digital) converter 20 (e.g., a DAP, Data Acquisition Chip which is commercially available from CRD/TI), which converts these analog signals to digital signals. In the present example, each sensor 12 and 16 is sampled by A/D converter 20 continuously at a rate of 2 MHz. The digital signals are presented over a bus 22 to a digital signal processor 24 (e.g., part no. TMS320 C17 commercially available from TI) where short interval calculations are performed.

These calculations are presented over a bus 26 to a microcomputer 28 (e.g., a Hitachi 8 bit microcomputer) which performs the demand calculations, e.g., rolling, block and/or thermal demand and energy calculations, e.g., kWh, and kvarh, kVAh or kQh. The kWh calculations can be accumulated as delivered, received, unidirectional (delivered+received) or bidirectional (delivered−received). The kvarh calculations can be accumulated as lagging, leading, unidirectional (lagging+leading) or bidirectional (lagging−leading). The kVAh calculations can be phasor, apparent or arithmetic apparent. The kQh calculation can be computed based on bidirectional Wh and varh at the end of each momentary interval, whereby if the result is positive, Qh is accumulated for that momentary interval and if the result is negative, Qh is not accumulated for that momentary interval. Data is displayed by a LCD (liquid crystal display) 30 in response to display signals received from microcomputer 28 over a signal line 32. As is typical in the industry, an energy calculation indicative of cumulative electricity usage is displayed. Calibration, testing, programming and other features are accomplished through an optical communications port 34, which communicates with microcomputer 28 over lines 36. Non-volatile RAM (random access memory) 38 is provided to store the data for the demand and energy calculations. RAM 38 communicates with the microcomputer 28 over a control bus 40. A power supply 42 which is powered by the service electricity, provides appropriate power over a line 44 to the components of meter 10. It will be appreciated that the use of non-volatile RAM 38 is important since information and system programming will not be lost during a power interruption or outage.

It will be appreciated that the present invention is also applicable to electronic demand registers i.e., optical or induction sensors for detecting rotation of a meter disk and generating pulses indicative of such rotation, as is well known. The electronic demand register is programmed to convert the number of pulses to KWh. Analogous to the above-described demand electronic energy meter, the electronic demand register is microcomputer based and can be modified, as described below, to incorporate load profile recording capabilities.

The above describes a demand electronic electricity meter to which is added load profile recording capabilities. A load profile recorder 46 is provided which communicates over the control bus 40 with the microcomputer 28. It is within the scope of the present invention that load profile capabilities be added to the meter by incorporating load profile logic or programming into microcomputer 28. Load profile recording requires memory for storing the recorded information, whereby either on-board memory (e.g., 8 K EEPROM) or external memory (e.g. 64 K EEPROM) is required. Load profile recorder 46 determines the memory type available, with preference being given to the external memory.

Load profile programming will determine memory availability and configure the memory, if not previously configured, before recording. The program allocates memory space to store three sets of time change log entries. Then the remaining memory is used to store whole blocks of load profile data, since partial blocks will not be maintained, some memory may be unused. Inputs for configuring load profile memory are transported in a standard table format (e.g., AMRA Utility Industry End Device Data Tables). Load profile parameters include the number of channels (e.g., 1 or 2 channels), interval size (e.g., 1, 5, 10, 15, 30 or 60 minutes), quantities to be recorded (e.g., kWh and kvarh, kVAh, or Qh) and channel scalar/divisor (e.g., for each channel, a 2 byte divisor and a 2 byte scalar).

With two channels, only two quantities are available for recording, kWh and the one other quantity that the meter has been configured to record, (e.g., kvarh, KVAh, or kQh). For each quantity selected, snapshots of the corresponding total accumulator; (i.e. total kWh and total kvarh, kVAh or kQh) are automatically maintained. It will be appreciated that with electronic demand registers incorporating load profile recording only one channel is required for recording total KWh.

To prevent the overflow of load profile interval accumulators, a programmable scalar and divisor must be provided for each channel. The energy accumulated in the interval is multiplied by the scalar and divided by the divisor. These values are preferably selected so that the stored value will fit in fourteen bits.

The load profile program performs the following functions on each of the channels. At the end of each minute, the quantity stored in a one-minute FIFO buffer is read and added to a current interval accumulator. At the end of the interval, the current interval accumulator value is divided by the programmed divisor, multiplied by the programmed scalar, and written to load profile memory. The remainder of the division is applied to the next interval.

In the present example, signed, scaled data is stored in the least significant 15 bits of memory per interval; with the 15th bit being a sign bit. Accordingly, the maximum capacity per interval in the present example is equal to plus or minus 16,382. If a data value, after scaling, is greater than 16,382 (or less than −16,382), then the value ±16,383 is recorded, the user is to assume that the interval data overflowed. Overflow data is not applied to the next interval, and thus, is lost. Preferably, a scaler is selected that will prevent such overflow. The sixteenth bit of each interval is used to indicate if a power outage is detected at any time during the interval, or if test mode was entered at any time during the interval.

Load profile memory is grouped into blocks as defined by the standard tables. Each block in the present example contains 96 intervals, a date/time stamp, and a snapshot of an accumulator for each channel. For one channel recording, each block will contain 203 bytes, i.e., (96 intervals ×2 Channel ×2 Bytes/Interval)+5 Date/Time Bytes+6 Accumulator Bytes=203 Bytes. For two channel recording, each block will contain 401 bytes, i.e., (96 intervals ×2 Channel ×2 Bytes/Interval)+5 Date/Time Bytes+6×2 Accumulator Bytes=401 Bytes.

At the end of each interval, data for the one or two channels is written to the current block, and the date and time stamp is updated. After 96 intervals have been written, a total accumulator value for each channel is written to the current block. When all blocks contain valid data, memory will wrap, and the oldest block is overwritten with the newest data.

For each time change, the following is stored:

| Date of Time Change | 3 bytes | YY/DD/MM |
|---|---|---|
| Time Prior to the Time Change | 2 bytes | HH/MM |
| Time Following the Time Change | 2 bytes | HH/MM |

Additionally the meter will store an index of the last time change (0,1,2). The time change log is zeroed and reset when load profile memory is reprogrammed or reset.

Standard tables are used to specify new values for the load profile interval length, the number of channels, scalar values, or the quantities to measure. Whenever any load profile configuration values are programmed, load profile memory will automatically be reset. If other data is programmed, but load profile configuration parameters are not, the load profile pointers will not be affected.

A command is provided to allow system software to reset either load profile or self read memory. Resetting of load profile memory consists of setting internal pointers and parameters to their initial state. Load profile data will not be zeroed as part of initialization or resetting; however, the time change log is zeroed as part of initialization or resetting.

The load profile program gives the date and time of the power fail, and the date and time of the recovery, as described below. All data in the current interval accumulator is applied to the interval when the power fail occurred. All other intervals between the power fail and power recovery are zeroed. If the current block, and any following blocks, are completed in the process of zeroing intervals, the date/time of the power fail are written for the time stamp, and the current total accumulator value is written to each.

In one embodiment the date and time of a power fail, and the date and time of the following recovery are determined with the aid of a battery 47 which maintains the microcomputer's real time clock (i.e., running time) during the power fail. It should be noted that the memories for storing system and load profile programming, and for recording the load profile (i.e., the accumulators) are non-volatile, as described above. In another embodiment, a battery is not employed. The time and date of a power fail is known, as it is the last time and date recorded. During power recovery two-way communication is re-established over the power lines by a line carrier network interface 48. Interface 48 communicates over the power lines with an energy management system at, e.g., a power company site, in accordance with the EIA CEBus IS-60 standard. A request for time and date update is made and time and date data are provided by the energy management system, thereafter load profile recording is resumed and the power fail is accounted for.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A device for metering electricity comprising:
    a measurement scheme for generating measured signals indicative of a quantitative value of electricity being metered;
    a signal processor system responsive to said measured signals, said system comprising a digital signal processor and a microcomputer coupled to said digital signal processor, said system further comprising a memory for storing signals including program signals defining an executable algorithm for calculating electricity energy signals; and
    a load profile recorder for recording the electricity energy signals in discrete time intervals, inputs for configuring said load profile recorder being transported to said recorder in a standard table format, said inputs comprising at least one of a number of channels, an interval size, quantities to be recorded, and channel scalar and divisor;
    said microcomputer programmed to transmit the electricity energy signals to said load profile recorder at predetermined time intervals, said load profile recorder comprising a processor programmed to store electricity energy signals; and
    a meter enclosure, said measurement scheme, said signal processor system, and said load profile recorder located at least substantially within said enclosure.

2. The device of claim 1 wherein said measurement scheme comprises:
    a voltage sensor for generating voltage signals indicative of the voltage of the electricity being metered;
    a current sensor for generating current signals indicative of the current of the electricity being metered; and
    wherein said measured signals comprise said voltage and current signals, and said quantitative value comprises voltage and current.

3. The device of claim 2 wherein said signal processor system further comprises:
    an A/D converter for converting said voltage and current signals to digital signals indicative thereof.

4. The device of claim 1 wherein said measurement scheme comprises:
    a meter disk which rotates in response to the electricity being metered;
    a sensor for detecting rotation of said meter disk, said sensor generating a plurality of pulses, said plurality of pulses comprise said measured signals.

5. The device of claim 1 wherein said load profile recorder includes:
    an accumulator for accumulating said electricity energy signals during each of said intervals to define a total energy value for each of said intervals, said total energy value for each of said intervals being written to a block within said memory.

6. The device of claim 1 wherein:
    said signal processor system includes a real time clock, said discrete time intervals being associated with said real time clock; and the device further comprising
    a battery for maintaining said real time clock during a power fail, said load profile recorder accounting for said discrete time intervals during the power fail.

7. The device of claim 1 further comprising:
    a line carrier network interface for two-way communication with a remote management system, said line carrier network interface for receiving time and date update information from the remote management system after recovery from a power fail, said load profile recorder utilizing said time and date update information to account for said discrete time intervals during the power fail.

8. The device of claim 1 wherein said electricity energy signals comprise kilowatt hours (KWhy, kilovar hours (Kvarh), kilovolt amp hours (KVAh), or kiloquadergy hours (KQh).

9. A method for metering electricity using a meter including a digital signal processor for generating digital data representative of energy consumed by a load, a microcomputer coupled to the digital signal processor, and a load profile recorder coupled to the microcomputer, said method comprising the steps of:

transporting to the load profile recorder inputs for configuring the recorder, the inputs being transported in a standard table format, the inputs comprising at least one of a number of channels, a time interval size, quantities to be recorded, and channel scalar and divisor;

generating, in the digital signal processor, digital measurement signals indicative of a quantitative value of electricity being metered;

transmitting the digital signal measurement signals to the microcomputer;

processing, in the microcomputer, the digital measurement signals to generate electricity demand signals;

transmitting, at preselected time intervals, the measurement signals to the load profile recorder;

scaling, in the recorder, the measurement signals; and recording, in the recorder, at least the scaled electricity demand signals in discrete time intervals.

10. The method of claim 9 wherein said step of generating said measurement signals comprises the steps of:

generating voltage signals indicative of the voltage of the electricity being metered;

generating current signals indicative of the current of the electricity being metered; and wherein said measurement signals comprise said voltage and current signals, and said quantitative value comprises voltage and current.

11. The method of claim 9 wherein said step of generating said measurement signals comprises:

detecting rotation of a meter disk which rotates in response to the electricity being metered to generate a plurality of pulses, said plurality of pulses comprise said measurement signals.

12. The method of claim 9 wherein said step recording comprises the steps of:

accumulating said electricity energy signals during each of said intervals to define a total energy value for each of said intervals; and storing said total energy values for each of said intervals in a block of memory.

13. The method of claim 12 further comprising the step of multiplying said electricity energy signals by a scalar and dividing by a divisor prior to accumulating.

14. The method of claim 9 further comprising the step of:

maintaining a real time clock during a power fail to account for said discrete time intervals during the power fail.

15. The meter of claim 9 further comprising the step of:

receiving time and date update information after recovery from a power fail to account for said discrete time intervals during the power fail.

16. An electricity meter for measuring electricity and generating electricity energy signals in response thereto, the meter including a microcomputer and a meter enclosure, wherein the improvement comprises:

a load profile recorder located within the meter enclosure and comprising a processor, said processor electrically coupled to the microcomputer for recording electricity energy signals in discrete time intervals, said load profile recorder comprising a processor programmed to scale the energy signals and to store at least the scaled signals, inputs for configuring said load profile recorder being transported to said recorder in a standard table format, said inputs comprising at least one of a number of channels, an interval size, quantities to be recorded, and channel scalar and divisor.

17. The meter of claim 16 wherein said load profile recorder includes:

an accumulator for accumulating said electricity energy signals during each of said intervals to define a total energy value for each of said intervals, said total energy value for each of said intervals being written to a block of memory in said meter.

18. The meter of claim 16 wherein said meter further comprises:

a real time clock, said discrete time intervals being associated with said real time clock; and a battery for maintaining said real time clock during a power fail, said load profile recorder accounting for said discrete time intervals during the power fail.

19. The meter of claim 16 further comprising:

a line carrier network interface for two-way communication with a remote management system, said line carrier network interface for receiving time and date update information from the remote management system after recovery from a power fail, said load profile recorder utilizing said time and date update information to account for said discrete time intervals during the power fail.

20. A demand only electronic register for measuring electricity and generating electricity demand signals in response thereto, wherein the improvement comprises:

a load profile recorder for recording electricity demand signals in discrete time intervals, said load profile recorder comprising a processor and a memory, said processor programmed to store demand signals in said memory, inputs for configuring said load profile recorder being transported to said recorder in a standard table format, said inputs comprising at least one of a number of channels, an interval size, quantities to be recorded, and channel scalar and divisor.

21. The register of claim 20 wherein said load profile recorder includes:

an accumulator for accumulating said electricity demand signals during each of said intervals to define a total energy value for each of said intervals, said total demand value for each of said intervals being written to a block of memory in said register.

22. The register of claim 20 wherein said register further comprises:

a real time clock, said discrete time intervals being associated with said real time clock; and a battery for maintaining said real time clock during a power fail, said load profile recorder accounting for said discrete time intervals during the power fail.

23. The register of claim 20 further comprising:

a line carrier network interface for two-way communication with a remote management system, said line carrier network interface for receiving time and date update information from the remote management system after recovery from a power fail, said load profile recorder utilizing said time and date update information to account for said discrete time intervals during the power fail.

24. A device for metering electricity comprising:

a measurement scheme comprising a digital signal processor for generating measured signals indicative of a quantitative value of electricity being metered; and a signal processor system responsive to said measured signals, and having a memory for storing signals including program signals defining an executable algorithm for calculating electricity energy signals, said system comprising recorder for executing an executable algorithm for recording electricity energy signals in discrete time intervals, said recorder comprising a processor programmed to record energy signals, inputs for configuring said recorder being transported to said recorder in a standard table format, said inputs comprising at least one of a number of channels, an interval size, quantities to be recorded, and channel scalar and divisor; and a meter enclosure, said measurement scheme and said signal processor system located at least substantially within said enclosure.

25. The device of claim 24 wherein said signal processor system includes:

an accumulator for accumulating said electricity energy signals during each of said intervals to define a total energy value for each of said intervals, said total energy value for each of said intervals being written to a block within said memory.

26. The device of claim 24 wherein:

said signal processor system includes a real time clock, said discrete time intervals being associated with said real time clock; and the device further comprising a battery for maintaining said real time clock during a power fail, said signal processor system accounting for said discrete time intervals during the power fail when recording.

27. The device of claim 24 further comprising:

a line carrier network interface for two-way communication with a remote management system, said line carrier network interface for receiving time and date update information from the remote management system after recovery from a power fail, said signal processor system utilizing said time and date update information to account for said discrete time intervals during the power fail when recording.

28. The device of claim 24 wherein said electricity energy signals comprise kilowatt hours (KWh), kilovar hours (Kvarhj, kilovolt amp hours (KVAh), or kiloquadergy hours (Kqh).

* * * * *